(12) United States Patent
Niedermeier

(10) Patent No.: US 7,635,954 B2  
(45) Date of Patent: Dec. 22, 2009

(54) CONFIGURATION AND METHOD FOR THE MANUFACTURE OF A FAILSAFE LED OR OLED CHAIN

(75) Inventor: Peter Niedermeier, Munich (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 207 days.

(21) Appl. No.: 11/948,866

(22) Filed: Nov. 30, 2007

(65) Prior Publication Data

US 2009/0122535 A1    May 14, 2009

(30) Foreign Application Priority Data

Nov. 30, 2006   (WO) ............... PCT/EP2006/069097

(51) Int. Cl.
*H05B 33/00* (2006.01)
*H05B 33/06* (2006.01)

(52) U.S. Cl. .............. 315/122; 315/145; 315/147; 315/310; 315/185 R; 438/80; 438/82; 438/89; 257/E27.12; 257/E27.125; 257/E27.149

(58) Field of Classification Search ............. 315/122, 315/125, 145, 147, 310; 438/66, 82, 89
See application file for complete search history.

(56) References Cited

U.S. PATENT DOCUMENTS

| | | | |
|---|---|---|---|
| 4,233,543 A | 11/1980 | Hickok | |
| 5,886,423 A | 3/1999 | Gershen et al. | |
| 6,800,999 B1 | 10/2004 | Duggal et al. | |
| 7,034,470 B2 * | 4/2006 | Cok et al. | 315/249 |
| 7,511,422 B2 * | 3/2009 | Kato | 313/506 |
| 2002/0190661 A1 * | 12/2002 | Duggal et al. | 315/169.1 |
| 2004/0032220 A1 * | 2/2004 | Cok et al. | 315/291 |
| 2006/0220585 A1 | 10/2006 | Negley et al. | |

FOREIGN PATENT DOCUMENTS

EP    1 396 676 A2    3/2004

* cited by examiner

*Primary Examiner*—Dao H Nguyen  
(74) *Attorney, Agent, or Firm*—Fish & Richardson P.C.

(57) ABSTRACT

A structural configuration of a failsafe OLED chain with multiple OLED lighting components in series connection is described. During the manufacture of the lighting component a weak spot is specifically installed at an appropriate location of the structure in the form of a break-through layer, which in the event of a failure of the lighting component breaks down and bypasses the component with a bypass layer.

12 Claims, 1 Drawing Sheet

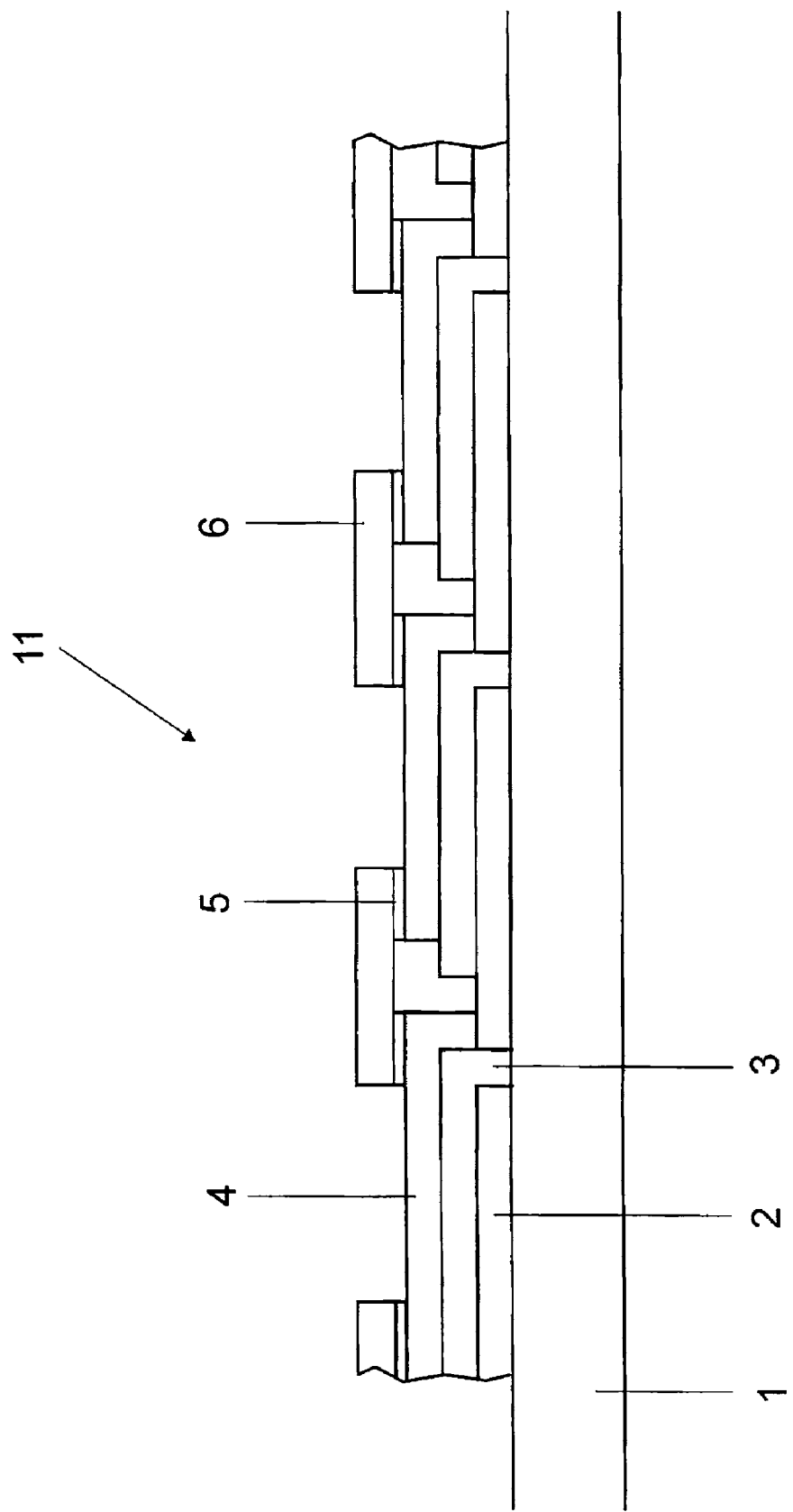

CONFIGURATION AND METHOD FOR THE MANUFACTURE OF A FAILSAFE LED OR OLED CHAIN

BACKGROUND

A series chain of LED or OLED lighting components is described.

Nowadays, LED and OLED lighting components are used for a number of lighting applications, e.g. in large displays, computer displays, cell phone displays, automotive signal lights, etc. In most cases, the applications require a large number of lighting components. Since OLEDs have a rather low operating voltage, several of them are usually connected in series in order to obtain a better distribution of the current within the application.

There is, however, the problem that if one individual lighting component fails the entire chain of serial LEDs will fail because the electric circuit is interrupted.

Since the OLEDs are often installed together on one substrate it is impossible to restore the functionality of the entire serial chain. The failure of a single component, on the other hand, would not be quite as noticeable within the large number of installed LEDs.

SUMMARY

A configuration of LEDs is described in which in the event of a failure of at least one LED the functionality of the remaining LEDs is ensured. In some embodiments, a series chain of LED or OLED lighting components is described where during the manufacture of the lighting component a weak spot is specifically incorporated in the form of a break-through layer capable of sufficiently insulating the normal forward voltage of the lighting component, but which in the event of a failure of the lighting component breaks through due to a high voltage level and bypasses the failed lighting component.

If a thin break-through layer, e.g., an oxide layer, is formed to span two adjacent LEDs and a bypass layer is above the break-through layer, a series of LEDs or OLEDs can be electrically connected even if one of the LEDs or OLEDs fails. The bypass layer is formed in embodiments of a conductive or semi-conductive material.

The break-through layer is applied to current entry points and breaks when an LED fails due to the high voltage level present at that point, thus electrically connecting the conductive layer above, that is, the bypass layer, and the current-supplying structure below (e.g., the cathode material). The connection closes the electric circuit and bypasses the failed LED or OLED.

The break-through layer, for example, may be electrically insulating and may be an oxide layer. The oxide layer may be a thin oxide layer.

The configuration according to the invention can be easily integrated into the manufacturing process of the LED or OLED, so that no or few additional components are required and no or little additional expenses are incurred.

Due to the fact that the thickness of the break-through layer is within a range, which allows the break-through layer to reliably break at multiples of the OLED forward voltage, the device is highly failsafe.

The fact that the break-through layer still insulates reliably at twice the component forward voltage level provides reliable protection against the unwanted bypassing of a still functioning OLED or LED component.

BRIEF DESCRIPTION OF THE DRAWING

Following is a description of a number of embodiments of the circuit configuration according to the device as referenced in the attached drawing.

The FIGURE shows the structure of an OLED with a failsafe serial configuration.

DETAILED DESCRIPTION

The FIGURE shows a schematic representation of the architecture of a series of components that form a device with a failsafe configuration. Applied to a carrier substrate (1), which may be glass, suitable types of film or a similar material, are several layers (2-4). The bottom layer is the anode layer (2) and consists of a conductive layer, e.g. an indium tin oxide layer (ITO).

Deposited on the anode are one or multiple layers of an organic material (3). They constitute the actual illuminating layer, which emits light. Deposited onto this layer is cathode material (4). Up to this point, the configuration reflects the configuration of an OLED lighting component 11. In many applications, the structures are configured to create a large serial chain of OLED lighting components. A conventional OLED chain has the disadvantage that the failure of one of these lighting components leaves the entire chain without power and therefore unable to function.

A break-through layer (5) is deposited onto the layer of cathode material (4). Deposited on top of the break-through layer (5) is a conductive layer (6) designed to bypass a failed component. The break-through layer (5) can be electrically insulating and may include an oxide layer. In some embodiments, the break-through layer (5) and conductive layer (6) are applied together such that the break-through layer (5) spans a full length of the conductive layer (6). In some embodiments the break-through layer (5) is only between the conductive layer (6) and the light device below the conductive layer (6) and does not extend between the two adjacent light devices. In some embodiments, a break-through layer (5) is only beneath one end of the conductive layer (6).

When an OLED lighting component (11) fails, the electric circuit is open and the voltage level between the cathode of the failed OLED lighting component and the cathode of the neighboring OLED lighting component is in all cases greater than the sum total of the forward voltages of all OLED lighting components in the chain. This means that this voltage is also present between the respective cathode layers and the conductive bypass layer, i.e., at the break-through layer. The break-through layer, unable to insulate such a high voltage, breaks down and conductively connects two adjacent cathode layers. As a result, the defective OLED lighting component is bypassed and the electric circuit is closed again, allowing the remaining OLED lighting components to operate normally.

The layer is preferably so thin that it will reliably break at multiples of the OLED forward voltage level.

When an OLED fails and interrupts the electric circuit, the voltage of the entire chain is applied to this OLED. This voltage is roughly the forward voltage of the OLEDs multiplied by their number. In some embodiments, such a chain is comprised of a number of OLEDs in the high one-digit range, thus this voltage is a multiple of the OLED forward voltage and the defective diode can be reliably bypassed.

At the same time, the layer should preferably be thick enough to reliably withstand at least the regular or twice the regular forward voltage of the series. This prevents the unwanted effect of a break-through in the event of brief voltage spikes or fluctuations, which may cause a still functioning OLED component to be bypassed and switched off.

A chain of LED lighting components can be treated in a similar manner. Due to the fact that LED lighting components are often built in the form of single chips and the anode at the top has a bonded wire, a cathode-to-cathode bypass is conceivable. Also possible for use is a wire equipped with a break-through layer—an oxide layer, for example—wrapped around the contact legs of a wired LED. In the case of SMD light-emitting diodes, the bypass could be installed on the underside between the contact plates. In some embodiments, instead of the bypass being adjacent to the cathode, the bypass can be adjacent to anodes of adjacent components. This configuration may be used, such as when the cathodes of the devices are closer to the substrate than the anodes.

What is claimed is:

1. A light emitting device including a series of light emitting components, comprising:
    a first light component defined in part by a conductive layer;
    a second light component defined in part by a conductive layer;
    a conducting bypass layer; and
    a break-through layer insulating the conducting bypass layer from the conductive layer of the first light component;
    wherein the break-through layer is configured so that in the event of a failure of the first lighting component, the break-through layer breaks down and allows the conducting bypass layer to electrically connect the conductive layer of the first light component to the conductive layer of the second light component.

2. The device of claim 1, wherein the conductive layer of the first light component is a cathode.

3. The device of claim 1, wherein a thickness of the break-through layer is such that the break-through layer is capable of reliably insulating a voltage of at least the level of the forward voltage of the lighting component.

4. The device of claim 1, wherein the thickness of the break-through layer is such that at a voltage level equal to a multiple of the forward voltage of an LED or OLED component, the break-through layer reliable breaks down.

5. The device of claim 1, wherein the break-through layer includes an oxide layer.

6. The device of claim 1, wherein the first light component is a light emitting diode.

7. The device of claim 1, wherein the first light component is an organic light emitting diode.

8. A method for manufacturing a light emitting device including a series of light emitting components, comprising:
    forming a first light component defined in part by a conductive layer and a second light component defined in part by a conductive layer;
    depositing an insulating break-through layer onto the conductive layer of the first light component; and
    depositing a conducting bypass layer onto the break-through layer and adjacent to the second light component.

9. The method of claim 8, wherein the conductive layer is a cathode.

10. The method of claim 8, wherein the break-through layer includes an oxide layer.

11. The method of claim 8, wherein forming the first light component includes forming a light emitting diode.

12. The method of claim 8, wherein forming the first light component includes forming an organic light emitting diode.

* * * * *